United States Patent [19]
Chiu

[11] Patent Number: 5,955,784
[45] Date of Patent: Sep. 21, 1999

[54] BALL CONTACT FOR FLIP-CHIP DEVICE

[75] Inventor: Anthony M. Chiu, Richardson, Tex.

[73] Assignee: Texas Instruments Incorporated, Dallas, Tex.

[21] Appl. No.: 08/200,850

[22] Filed: Feb. 22, 1994

Related U.S. Application Data

[63] Continuation of application No. 07/945,185, Nov. 19, 1992.

[51] Int. Cl.⁶ .............................. H01L 23/48; H01L 23/52
[52] U.S. Cl. .......................... 257/737; 257/738; 257/780; 257/786; 257/778
[58] Field of Search ................................... 257/668, 778, 257/738, 737, 780, 786, 779

[56] References Cited

U.S. PATENT DOCUMENTS

| | | | |
|---|---|---|---|
| 2,934,685 | 4/1960 | Jones | 317/235 |
| 3,809,625 | 5/1974 | Brown et al. | 204/15 |
| 3,871,014 | 3/1975 | King et al. | 357/67 |
| 4,369,458 | 1/1983 | Thomas et al. | 257/737 |
| 4,600,600 | 7/1986 | Pammer et al. | 427/89 |
| 4,838,347 | 6/1989 | Dentini et al. | 165/185 |
| 5,001,542 | 3/1991 | Tsukagosh et al. | 257/737 |
| 5,010,038 | 4/1991 | Fox et al. | 437/215 |
| 5,207,585 | 5/1993 | Byrnes et al. | 439/66 |

FOREIGN PATENT DOCUMENTS

| | | | |
|---|---|---|---|
| 30758A2 | 3/1993 | European Pat. Off. | 257/778 |
| 6467805 | 10/1990 | Japan | 257/786 |

*Primary Examiner*—Teresa M. Arroyo
*Attorney, Agent, or Firm*—Robby T. Holland; Carlton H. Hoel; Richard L. Donaldson

[57] ABSTRACT

A contact for a semiconductor device or passive substrate is made up of an array of conductive balls, the individual balls of the contact being a compressible material coated with a metal conductive material. The balls in the array are compressed while being bonded to the contact area to provide a larger bond area between the ball and the contact area to which it is bonded.

8 Claims, 4 Drawing Sheets

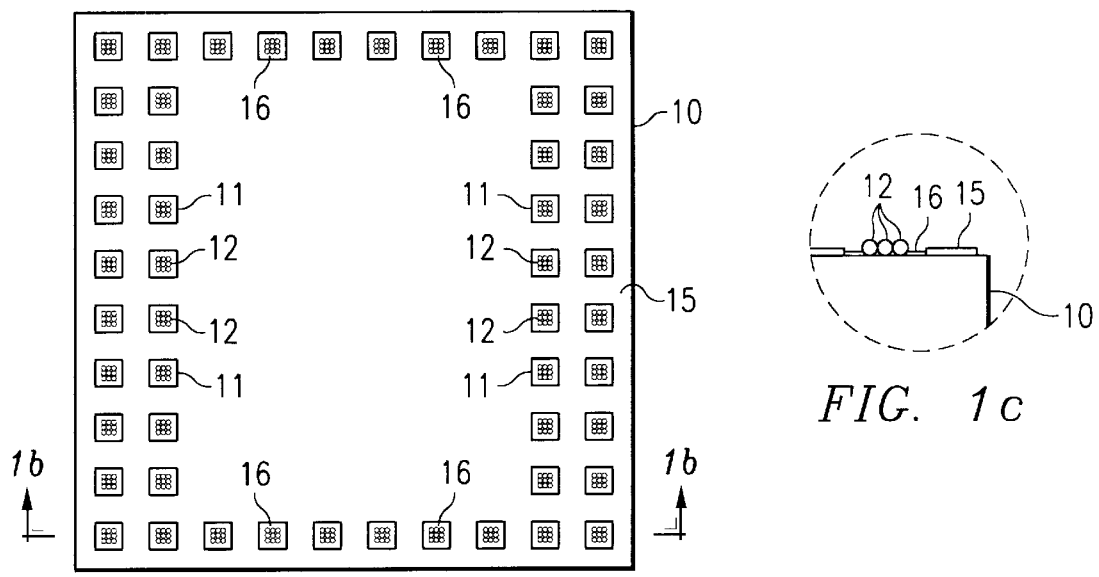
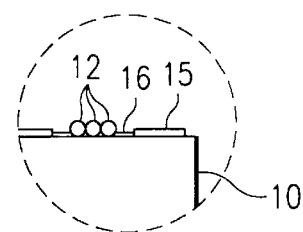
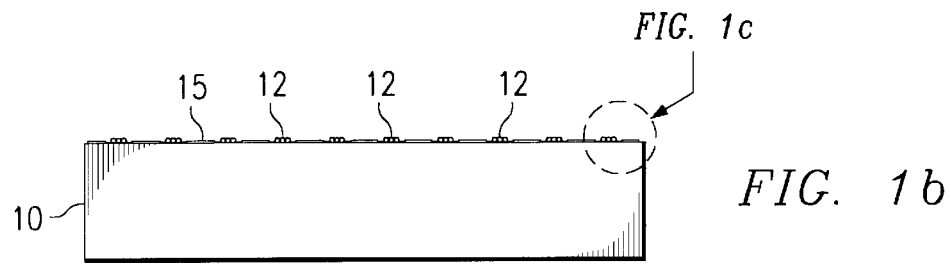
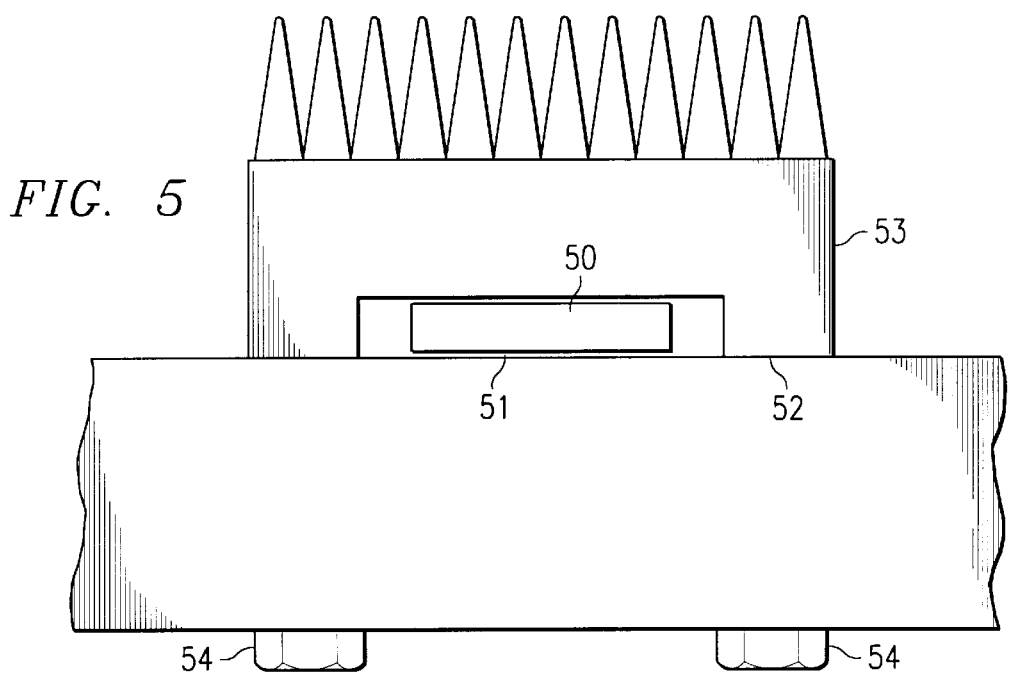

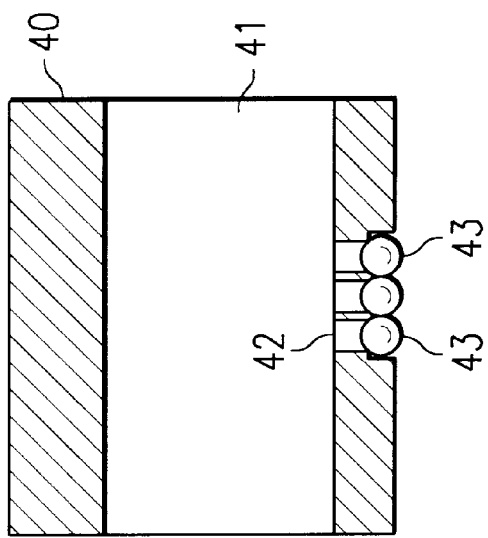
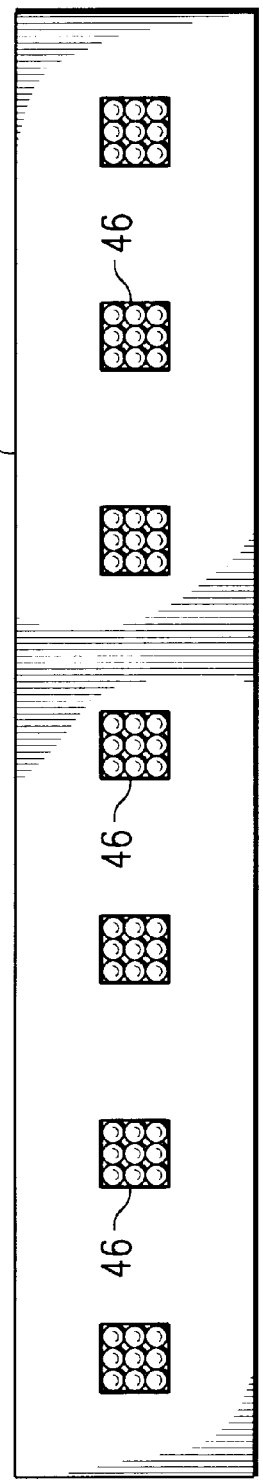

BALL CONTACT FOR FLIP-CHIP DEVICE

This application is a Continuation of application Ser. No. 07/945,185, filed Nov. 19, 1992.

FIELD OF THE INVENTION

This invention relates to contacts for semiconductor devices and passive substrates, and more particularly to multiple balls used for an individual contact.

BACKGROUND OF THE INVENTION

Contacts for semiconductor devices include bond pads deposited on the surface of the semiconductor chip, and gold wire bonds bonded to a bond pad on the device. High performance electronic hardware is characterized by high clock rate and high power. To package this class of systems, flip-chip assembly is the preferred assembly process. There are currently three major flip-chip assembly processes, all involving forming some type of contact, protruding above the bond pad of the active silicon chip (integrated circuit).

A first method employs a conventional wire bonding process. Instead of bonding to the leadframe or substrate, the bond wire is cut a 5 to 20 mils above the ball. This process usually take place after the chip is singulated from the wafer.

A second method employs a molten solder squeezed through a mask onto on a singulated chip or electroplating solder using photo-lithography techniques onto a wafer.

A third method employs an adhesive loaded with conductive particles such as gold plated metal balls or solder balls. In order to avoid shorting to adjacent conductive particles, these particles are dispersed in a controlled amount such that only one ball might contact the bond pad.

Single ball contacts, as described by the third method above, have been used. However, with the use of a single ball contact, the contact area between the ball contact and the flat contact surface of the device or circuit board to which the device is connected is a very small area, and oxides or other impurities between the ball contact and the flat contact surface of the mounting circuit board may prevent proper electrical contact between the device and the circuit board. Because of the small size of the ball, the current carrying capacity is greatly reduced.

SUMMARY OF THE INVENTION

The invention is to a contact arrangement, the apparatus for applying the contacts and the method of applying the contacts to a semiconductor device or to a passive substrate.

The contact elements are elastomer balls that have an electrical conductive coating on the ball. Any metallic coating may be used, but gold is particularly useful when making contact to aluminum contacts on a semiconductor chip. A plurality of balls are arranged in an array on a contact pad and bonded to the pad. Through the use of multiple balls, a greater contact area for each contact on a device is present for contacting the device to a circuit board or other mounting surface.

The metallic coated balls are placed in a stacking machine and vibrated to arrange the balls in a single row or stacked row of balls. The balls are then picked up by a fixture utilizing a vacuum to hold the balls arranged in an array. The pick-up fixture may hold a single array of balls for a single contact or may pick up a plurality of arrays of balls for multiple contacts. The pick-up fixture moves the contact array of balls to the contact area on the semiconductor chip and places the contact ball array on the bond pads, or land pads for passive devices.

The balls are bonded by thermo-sonic or thermal compression bonding. During bonding a pressure is applied to the balls causing them to flatten, presenting a larger contact area between the ball and the contact mounting area.

The completed device with the ball-array at each contact may then be mounted on a substrate and held in place with a heat sink or other device that holds the device against the mounting substrate with a force sufficient to partially compress the ball-contacts, presenting an enlarged area between each ball contact in an array and the mounting substrate.

The technical advance represented by the invention as well as the objects thereof will become apparent from the following description of a preferred embodiment of the invention when considered in conjunction with the accompanying drawings, and the novel features set forth in the appended claims.

BRIEF DESCRIPTION OF THE DRAWINGS

FIG. 1a is a top view of a semiconductor device having ball-array contacts;

FIG. 1b is a cross-sectional view of the device of FIG. 1 taken through section A—A;

FIG. 1c is an enlarged portion of the sectional view of FIG. 1b;

FIG. 4a illustrates a single ball array pick-up fixture;

FIG. 4b illustrates a pick-up fixture for multiple ball arrays; and

FIG. 5 illustrates a mounted device having ball array contacts.

DESCRIPTION OF A PREFERRED EMBODIMENT

Figure 2A:
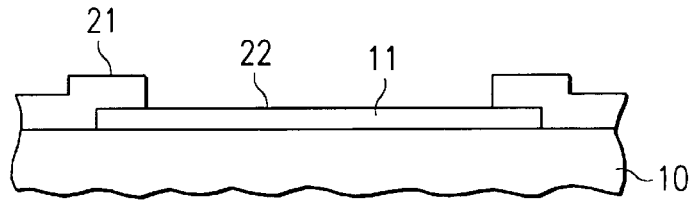
FIGS. 2a–2e illustrate the process of attaching the ball-contacts to a semiconductor chip.

FIG. 1a illustrates the top surface of a semiconductor chip 10 having an array of contacts 11 thereon. Each contact is made up of an array of ball contacts 12 bonded to the contact surface of the chip. Each contact has an array of nine balls, but any number of balls, preferably an n×n array, may be used, where n is a whole number greater than 1.

FIG. 1b is a cross-sectional view taken through section A—A of FIG. 1a. Semiconductor chip 10 has an oxide or other insulating layer 15 thereon. Contact balls 12 are bonded to the contact areas of chip 10 in openings 16 below layer 15. The details of a ball-array contact is shown in the enlarged view presented by FIG. 1c.

FIGS. 2a–2e illustrate process steps in attaching the ball array to the contact area on the semiconductor device. FIG. 2a shows the semiconductor chip 10 having a layer of insulating material 21 on the surface of the chip. An opening 11 is under the insulating layer 21 representing the chip contact area.

Figure 2B:
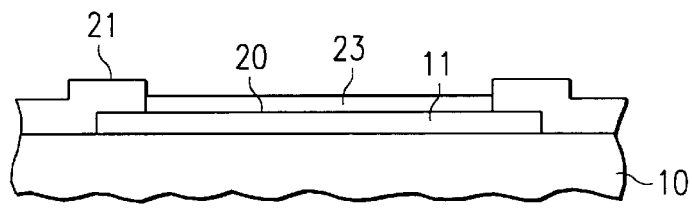
Figure 2C:
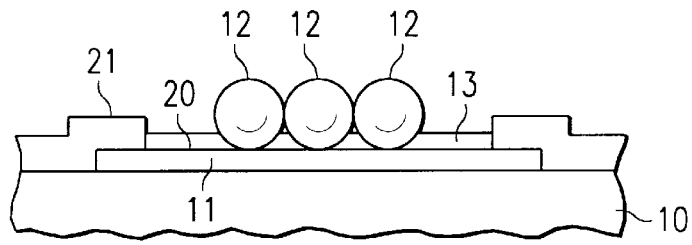

In FIG. 2b, a layer of conducting adhesive or surface cleaning chemical 23 is placed in opening 22. The ball-array is placed in opening 22 and is held in place by adhesive 13 (FIG. 2c).

Figure 2D:
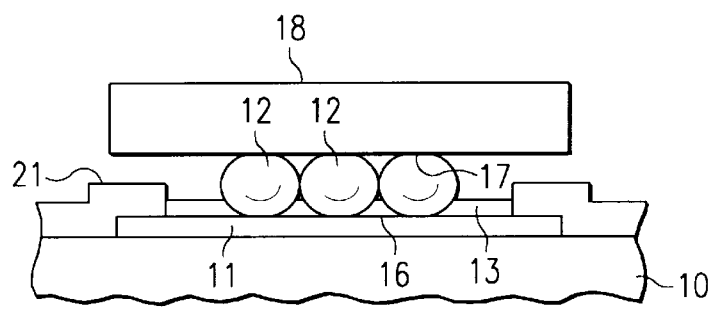
Figure 2E:
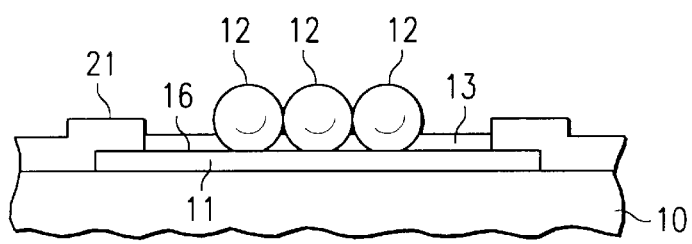

In FIG. 2d, a bonding tool 18 is lowered on the ball array. The balls of the ball array are elastomer balls that have an electrical conductive coating on the ball. Any metallic coating may be used, but gold is particularly useful when making contact to aluminum contacts on a semiconductor chip. The bonding tool provides a downward pressure on the ball, flattening them at 16 and 17. The balls are thermo-sonic or thermal compression bonded to the chip interface at 16. As illustrated in FIG. 2e, the ball/chip interface at 16 is bonded and remains flat, providing a greater contact area between the ball array contact and the chip contact area.

Figure 3:
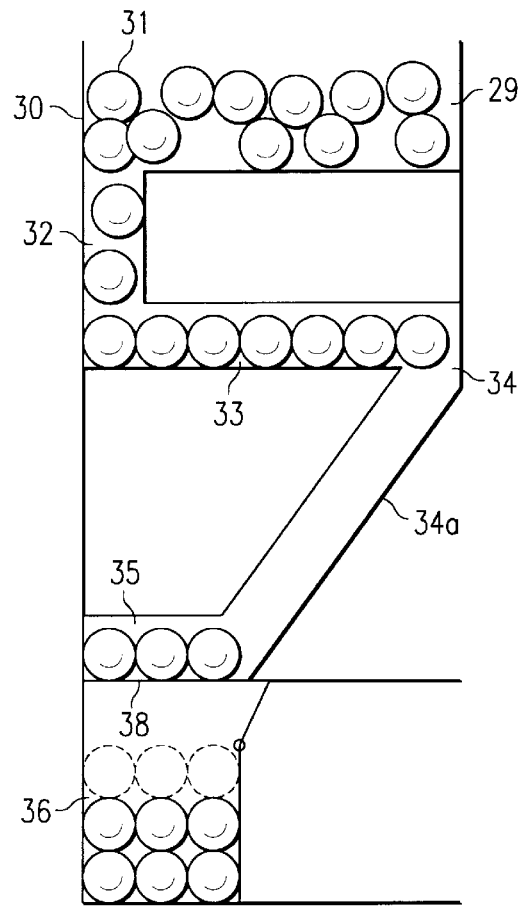
FIG. 3 illustrates a ball stacking apparatus.

FIG. 3 illustrate a ball stacking machine used to provide the array of balls for the ball array contact. Machine 30 has a reservoir 29 in which balls 31 are placed. The balls are fed through track 32 and arranged in a single row on track 33. A vibratory system (not illustrated) is attached to machine 30 agitate the balls so they will move through track 32 to track 33. The balls on track 33 fall through opening 34 and roll down incline 34a to arrange the balls in a single row as illustrated at 35. A shutter type door 38 drops the row of three balls to stack the balls in a single row as shown at 36.

FIG. 4a illustrates a pick-up tool for a single ball array. Tool 40 has a vacuum drawn through the interior through channel 41. There is an array of openings 42 in one wall of tool 40 that is arranged and of a size to hold a single ball array. The balls are held in place until the array is placed over a contact area and the ball array is pressed into the adhesive on the semiconductor contact area. The vacuum is released and the ball-array remains in place until bonding energies are applied onto the balls through the pick-up tool and until the balls are bonded to the chip as illustrated in FIG. 2e.

FIG. 4b illustrates a pick-up assembly 45 that can hold a plurality of ball-arrays. There are as many array openings 46 as needed to span a row of contacts as illustrated in FIG. 1a.

After the semiconductor chip has all the ball-array contacts in place, it may then be mounted, for example, in a flip-chip configuration, FIG. 5. Semiconductor chip 50 is placed, contact side down, on a mounting substrate 52. Substrate 52 may be a printed circuit board, a large semiconductor device or other mounting surface such that each ball-array contact 51 comes into contact with a contact area or connection area. A heat sink or other clamping device 53 is placed over semiconductor chip 50, provides a downward pressure on chip 50 holding it in place. The downward pressure tends to flatten the balls in each ball-array contact providing a large contact area than a single ball, or other not compressible contacts. Semiconductor chip 50 does not need to be permanently affixed to the substrate. The compressible ball-array contact provides good contact with the substrate without permanent bonding and chip 50 may be changed in the event of failure.

Figure 6:
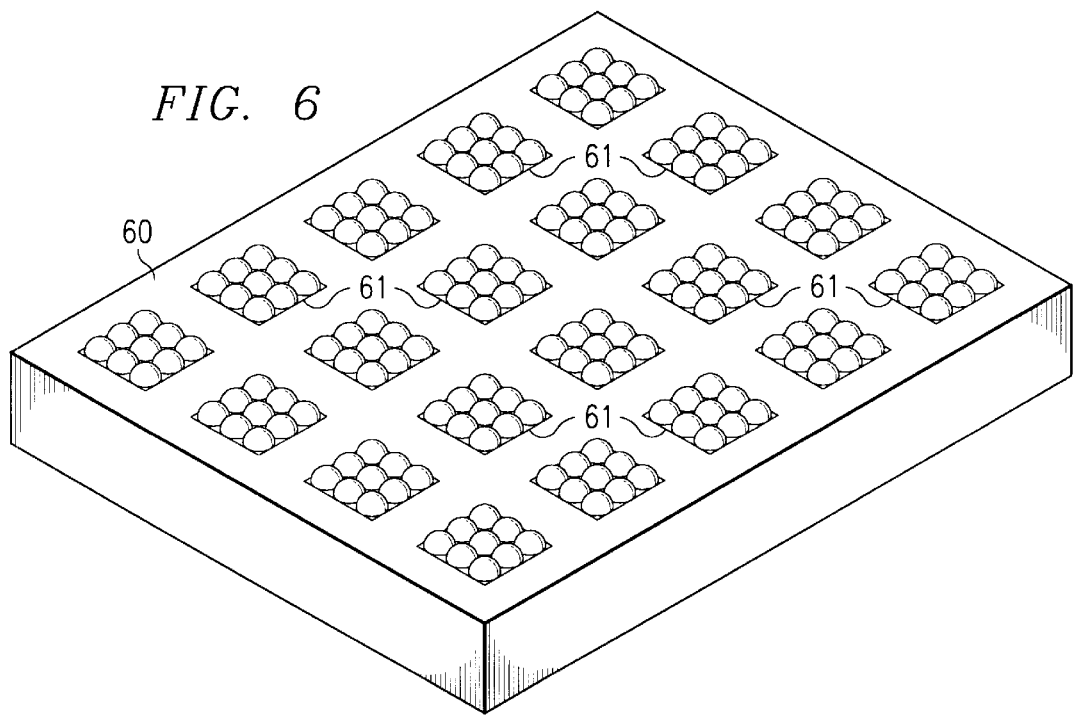
FIG. 6 is a chip or passive substrate having ball array contacts.

FIG. 6 illustrates the use of ball-array contacts over the surface of a semiconductor chip or a passive substrate.

What is claimed:

1. A contact for a semiconductor device, comprising:
   a plurality of flexible conductive balls, in an n×n array, n being a whole number greater than 1, each n×n array forming a single contact; and
   a flattened area on each conductive ball at which said conductive ball is secured to the semiconductor device contact area.

2. The contact according to claim 1, wherein said conductive balls in each contact array is of a flexible material coated with a highly conductive material.

3. The contact according to claim 2, wherein the flexible material is an elastomer material.

4. The contact according to claim 2, wherein said conductive material is gold.

5. A contact for a semiconductor device, comprising:
   at least one n×n array of compressible, flexible, conductive ball elements, n being a whole number greater than 1, forming a single contact; and
   a flattened area on each conductive ball in the array securing said conductive ball to the semiconductor device contact area.

6. The contact according to claim 5, wherein said conductive ball elements are balls of a flexible material coated with a metallic material.

7. The contact according to claim 6, wherein the flexible material is an elastomer material.

8. The contact according to claim 6, wherein said metallic material is gold.

\* \* \* \* \*